United States Patent
Borgwardt

(10) Patent No.: US 10,199,195 B2
(45) Date of Patent: Feb. 5, 2019

(54) CIRCUIT BREAKER AND METHOD

(71) Applicant: Siemens Aktiengesellschaft, Munich (DE)

(72) Inventor: Andre Borgwardt, Schoenwalde-OT Paaren (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 400 days.

(21) Appl. No.: 15/187,108

(22) Filed: Jun. 20, 2016

(65) Prior Publication Data

US 2017/0053759 A1 Feb. 23, 2017

(30) Foreign Application Priority Data

Aug. 21, 2015 (DE) .................. 10 2015 216 023

(51) Int. Cl.
*H01H 71/12* (2006.01)
*G01R 31/06* (2006.01)
*H01H 71/04* (2006.01)

(52) U.S. Cl.
CPC .......... *H01H 71/125* (2013.01); *G01R 31/06* (2013.01); *H01H 2071/044* (2013.01); *H01H 2300/052* (2013.01)

(58) Field of Classification Search
CPC .................. G01R 31/06; H01H 71/125; H01H 2071/044; H01H 2300/052
See application file for complete search history.

(56) References Cited

U.S. PATENT DOCUMENTS

| | | | |
|---|---|---|---|
| 6,522,517 B1* | 2/2003 | Edel | G01R 15/185 361/143 |
| 7,906,974 B2 | 3/2011 | Berberich | |
| 8,970,224 B2 | 3/2015 | Fischer | |
| 2002/0109507 A1* | 8/2002 | Khalin | G01R 31/027 324/547 |
| 2011/0031979 A1* | 2/2011 | Gillberg | F02P 3/0554 324/546 |
| 2013/0027046 A1 | 1/2013 | Leif | |
| 2014/0306716 A1* | 10/2014 | Ball | H02H 3/52 324/538 |

FOREIGN PATENT DOCUMENTS

| | | |
|---|---|---|
| DE | 102005036769 A1 | 2/2007 |
| DE | 102011082172 A1 | 3/2013 |

* cited by examiner

*Primary Examiner* — Scott Bauer
(74) *Attorney, Agent, or Firm* — Harness, Dickey & Pierce, P.L.C.

(57) ABSTRACT

A circuit breaker includes at least one coil for measuring electric current of an electrical conductor of an electrical circuit, connected to a control unit which compares the measured current or its equivalent with a first current limit value. Upon the first current limit value being exceeded, the control unit initiates an interruption of the electrical circuit. The two terminals of the coil are connected via a series circuit which has a first switch opened in its basic state, a voltage source and a voltage indicator. The control unit is designed such that, when a second current limit value is undercut and a first period of time is exceeded, the first switch is closed for a second period of time, the voltage indicator compares the voltage present with a first voltage value and, when the latter is exceeded, delivers information on the absence of faults of the coil.

19 Claims, 3 Drawing Sheets

CIRCUIT BREAKER AND METHOD

PRIORITY STATEMENT

The present application hereby claims priority under 35 U.S.C. § 119 to German patent application number DE 102015216023.8 filed Aug. 21, 2015, the entire contents of which are hereby incorporated herein by reference.

FIELD

At least one embodiment of the invention generally relates to a circuit breaker having a coil for measuring current, and/or to a method for a circuit breaker having a coil for measuring current.

BACKGROUND

Circuit breakers are used as switching and protection devices in electrical circuits, particularly in multi-phase power systems. In particular, they are applied in low-voltage networks, i.e. power systems with voltages of up to 1000 V alternating voltage or 1500 volt direct voltage. In particular, circuit breakers and switch currents from 63 amperes or 100 amperes or for currents of up to 1000 amperes, 6300 amperes or 10 000 amperes.

Circuit breakers measure the electric current in the electrical circuit and interrupt the circuit when current limit values are exceeded which occur, for example, in the case of overload or short circuit in the electrical circuit.

To measure the electric current in the conductors, coils are frequently used. In particular, Rogowski coils are widely applied. They are also called Rogowski transducers or Rogowski transformers.

If the measuring unit for measuring the electrical current in a circuit breaker fails, the protective function in the electrical circuit is no longer guaranteed since overloads and short circuits can no longer be determined.

SUMMARY

At least one embodiment of the present invention includes maintaining the protective function in the electrical circuit.

At least one embodiment is directed to a circuit breaker and/or a method.

According to at least one embodiment of the invention, an electric test voltage and a voltage indicator are connectable to the coil for measuring the current. In this context, the test voltage is connected in series, for example by way of a voltage source, with a voltage indicator and the coil to be tested. According to at least one embodiment of the invention, this series circuit is connected to the coil when the current drops below a second current limit value, i.e., considered relatively, is very small or close to zero or is zero. For example, this second current limit value can be about 10 amperes or 1 ampere in the case of an open circuit breaker which can be designed for currents of up to 10 000 amperes. Any value within the range of 500 mA to 20 A or even up to 80 A would be possible here.

At least one embodiment is directed to a circuit breaker having at least one coil for measuring the electric current of an electrical conductor of an electrical circuit, which is connected to a control unit which compares the measured current or its equivalent with a first current limit value and, when the latter is exceeded, initiates an interruption of the electrical circuit, wherein the two terminals of the coil are connected to one another by a series circuit, having a first switch opened in its basic state, a voltage source and a voltage indicator, and in that the control unit is designed in such a manner that, when a second current limit value is undercut for a first period of time, the first switch is closed for a second period of time, the voltage indicator compares the voltage present with a first voltage value and, when the latter is exceeded, delivers information on the absence of faults of the coil.

At least one embodiment is directed to a method for a circuit breaker having a coil for measuring the electric current of an electrical conductor of an electrical circuit, the measured current or its equivalent being compared with a first current limit value and when the latter is exceeded, an interruption of the electrical circuit is initiated, wherein, when a second current limit is undercut and a first period of time is exceeded, a connection of a test voltage with a series-connected voltage indicator to the coil is initiated for a second period of time and when a first voltage value is exceeded, an information on the operability of the coil is present on the voltage indicator.

BRIEF DESCRIPTION OF THE DRAWINGS

The characteristics, features and advantages of embodiments of the invention described and the way in which these are achieved will become clearer and more distinctly comprehensible in connection with the following description of the example embodiments which will be explained in greater detail in connection with the drawings.

An example embodiment of the invention will be explained in greater detail by way of the drawing, in which.

DETAILED DESCRIPTION OF THE EXAMPLE EMBODIMENTS

Figure 1:
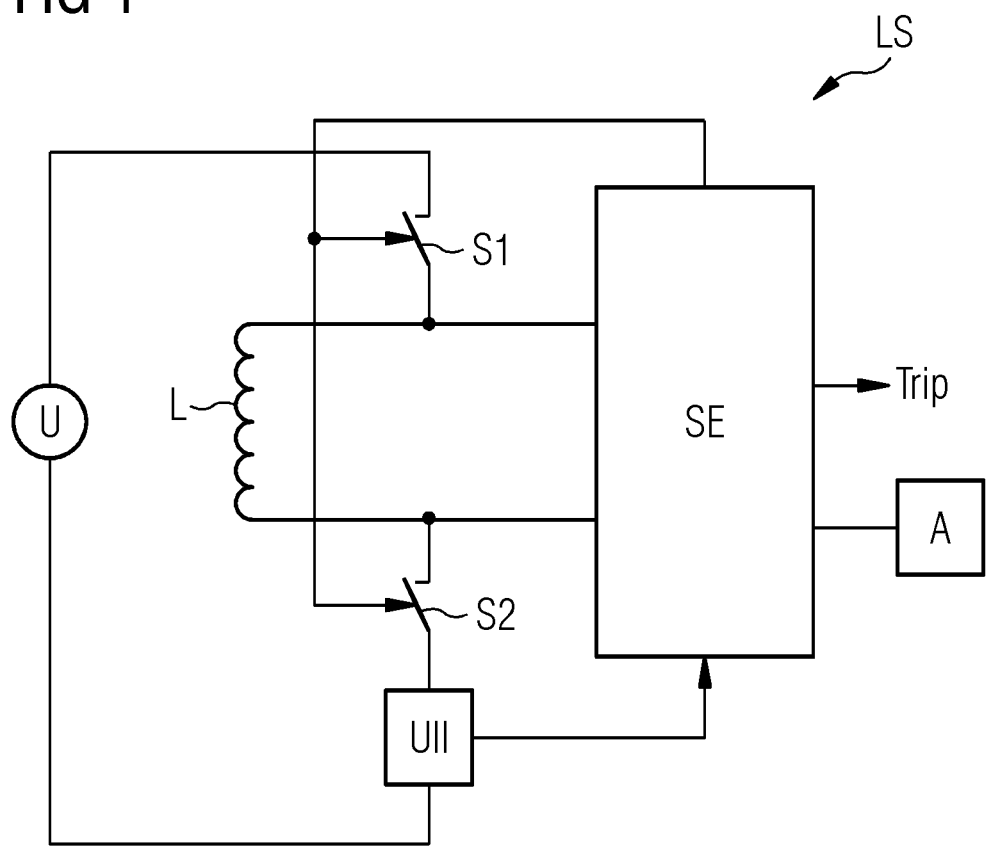
FIG. 1 shows a first block diagram in explanation of an embodiment of the invention.

In the following, embodiments of the invention are described in detail with reference to the accompanying drawings. It is to be understood that the following description of the embodiments is given only for the purpose of illustration and is not to be taken in a limiting sense. It should be noted that the drawings are to be regarded as being schematic representations only, and elements in the drawings are not necessarily to scale with each other. Rather, the representation of the various elements is chosen such that their function and general purpose become apparent to a person skilled in the art.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

According to at least one embodiment of the invention, an electric test voltage and a voltage indicator are connectable to the coil for measuring the current. In this context, the test voltage is connected in series, for example by way of a voltage source, with a voltage indicator and the coil to be tested. According to at least one embodiment of the invention, this series circuit is connected to the coil when the current drops below a second current limit value, i.e., considered relatively, is very small or close to zero or is zero. For example, this second current limit value can be about 10 amperes or 1 ampere in the case of an open circuit breaker which can be designed for currents of up to 10 000 amperes. Any value within the range of 500 mA to 20 A or even up to 80 A would be possible here.

Furthermore, testing of the coil for measuring current is carried out only when no current has been measured for a certain period or the current is below the second current limit value. In this case, i.e. when no current has been measured, suspicion of a broken wire of the coil for measuring current suggests itself which, according to at least one embodiment of the invention, should be cleared up for safety reasons so that a check according to at least one embodiment of the invention is performed. If the coil for measuring current is in order, a voltage which approximately corresponds to the voltage of the voltage source minus the relatively slight voltage drop due to the coil resistance of the coil is measured at the voltage indicator. By this, the operability or freedom from fault of the coil can be determined when a first voltage value is exceeded at the voltage indicator.

If the coil is broken, no current can flow through the coil, the circuit is interrupted and the voltage indicator cannot detect a voltage. Thus, a fault of the coil is determined and a corresponding information on the presence of a fault case can be delivered.

The measurement can take place over a short time, for example within the millisecond range in order to determine a wire fracture of the coil.

At least one embodiment of the invention has the special advantage that a test with regard to the operability of the coil for measuring current can be performed during the current operation of a circuit breaker, particularly when no or a very low current is measured. In this context, it is of no importance whether the control unit which evaluates the electric current or voltage of the coil as a measurement quantity is also connected in parallel. As a rule, the connection for the coil is of high impedance, is frequently within the mega-ohm range so that no or a very low current flows through it which does not influence the test.

Advantageous embodiments of the invention are specified in the subclaims.

In an advantageous embodiment of the invention, the coil is a Rogowski coil. This has the special advantage that by this, a particularly good measurement of the electric current of low and large currents and within a wide frequency range is possible. Fault detection is not simple in the case of the Rogowski coil and is possible particularly easily by way of the method according to at least one embodiment of the invention.

In an advantageous embodiment of the invention, in the series circuit a second switch, opened in its basic state, is provided for the bipolar connection and disconnection of the series circuit to the coil. In a further embodiment of the same, a terminal of the first switch is connected to the first terminal of the coil and a terminal of the second switch is connected to the second terminal of the coil, and the series-connected voltage source plus voltage indicator are located between the other two terminals of the switches. This has the special advantage that in the basic state, no unilateral connection of a series circuit is present at the coil which could change the symmetry of the coil for measuring current and thus could falsify the result of the measuring current or load it with an offset. The coil is frequently connected to a symmetric differentiation input as a result of which the symmetry could be changed in the case of a unilateral connection of components to the coil.

In an advantageous embodiment of the invention, the voltage source is a direct-voltage source. This has the special advantage that by this, a particularly simple implementation is possible, particularly due to the use of simple voltage indicators which becomes possible by this.

In a particularly advantageous embodiment of the invention, the voltage indicator has a Schmitt trigger. This has the special advantage that by this, a simple standardized implementation of the voltage indicator is possible.

In an advantageous embodiment of the invention, the control unit has a microprocessor. This has the special advantage that it provides for a particularly simple and firmware-adaptable implementation of the control unit.

In an advantageous embodiment of the invention, the control unit has a high-impedance input to which the coil is connected. This has the special advantage that a particularly unaffected testing of the coil for a fault can be performed since a very low current flows through the control unit.

In an advantageous embodiment of the invention, an output unit connected to the control unit is provided which optically, acoustically and/or wirelessly delivers information on the lack of absence of faults. This has the special advantage that an operator is informed on the wire break or fault of the coil for measuring current.

In an advantageous embodiment of the invention, the control unit is designed in such a manner that an interruption of the electrical circuit is initiated in the case of a fault of the coil. This has the special advantage that an unprotected operation of a system such as a low-voltage switching installation is avoided.

In an advantageous embodiment of the invention, the first and/or second period of time is parameterizable. This has the special advantage that the user can adapt the function very flexibly and optimally to his application.

In an advantageous embodiment of the invention, the control unit is designed in such a manner that when a series circuit or test voltage, respectively, is connected, an interruption of the electrical circuit is prevented. This has the special advantage that the circuit breaker does not erroneously interrupt or trigger the electrical circuit during the short testing of the coil. Due to the test voltage, the control unit could falsely detect a current flow which could lead to an unwanted triggering. When the series circuit is connected, the interruption or triggering should be prevented for the duration of the connection of the series circuit, i.e. the test voltage. Since the series circuit is only connected for a short period of time, this is justifiable.

In an advantageous embodiment of the invention, the second current limit value is within the range of 500 mA to 20 A and/or the first period of time lies within the range of 5 ms to 50 s and/or the second period of time lies within the range of 10 microseconds to 10 seconds. These said periods of time have been found to be particularly advantageous for the practical use of the invention in a circuit breaker, particularly in an open circuit breaker.

The invention is advantageously developed further by all its embodiments.

FIG. 1 shows a section of a part of a circuit breaker LS having a coil L for measuring the electric current I of an electrical conductor of an electrical circuit, not shown. The coil L is connected on both sides to a control unit SE. The coil L supplies a current or a voltage which corresponds to the measured current of the electrical conductor, not shown. I.e. the coil L supplies a quantity for the measured electric current, i.e. an equivalent.

This measured quantity is evaluated by the control unit SE of the circuit breaker and an interruption of the electrical circuit, not shown, is initiated at least when a first current limit value I1 is exceeded. This is shown by an arrow with the designation trip by which an interruption is initiated, for example by an interruption device, not shown, for example by contacts which open an electrical circuit.

As a rule, the current measuring quantity supplied by the coil L, for example a voltage proportional to the measured current, is detected by a high-impedance device in the control unit SE. The coil L is advantageously a Rogowski coil by which a large current measuring and frequency range of the current to be measured can be detected.

According to an embodiment of the invention, it is then provided that the two terminals of the coil L are connected to a series circuit of a voltage source U, advantageously a direct-voltage source, for example with a voltage of 3.3 volts, a voltage indicator UII and a first switch S1. The switch S1 is opened in the basic state and is closed for the test process. Advantageously, a second switch S2 can also be provided which is also opened in the basic state, both switches S1, S2 being actuated simultaneously. The switches are preferably arranged at the coil terminals.

If no current is measured in the electrical circuit, the coil can be tested, for example a Rogowski coil. For this purpose, both switches S1, S2 are closed for a short time according to FIG. 1, for example by a signal from the control unit SE and it is determined by the voltage indicator whether a voltage is present. If this voltage exceeds a first voltage value U1, which is selected in such a manner that it corresponds to the voltage of the voltage source U minus the voltage flop due to the coil impedance minus any contact and line impedances and tolerances, the coil is in order for measuring and operates faultlessly. In the other case, a coil fault is present which prevents the current measurement and thus prevents a correct operation of the circuit breaker. A corresponding information or message can be delivered by an output unit A connected to the control unit. This can be optical information (LED, lamp), acoustic information (summer) and/or wireless information, for example by a radio message.

Furthermore, the control unit can initiate an interruption of the electrical circuit in the case of the presence of a wire break in the coil so that the electrical circuit is not unprotected. Furthermore, a renewed switch-on of the circuit breaker can be prevented by the control unit as long as there is no wire break or lack of continuity in the coil.

At a voltage of the voltage source of 3.3 volts, a voltage value U1 of 2.1 volts is practicable. This also has the advantage that standard digital inputs can be used for evaluating the voltage level.

The test or measurement should be carried out especially when no current flow is detected. From experience, it could also be a broken wire of the coil for measuring current.

I.e. when a certain current value I2 is undercut for a certain period of time t1, a test is performed for a period of time t2 which can be relatively short.

In this time, triggering or interruption of the circuit breaker can be prevented or suppressed by the control unit. For example, the control unit SE initiates the test process and suppresses the interruption of the electrical circuit for the same period of time.

Figure 2:
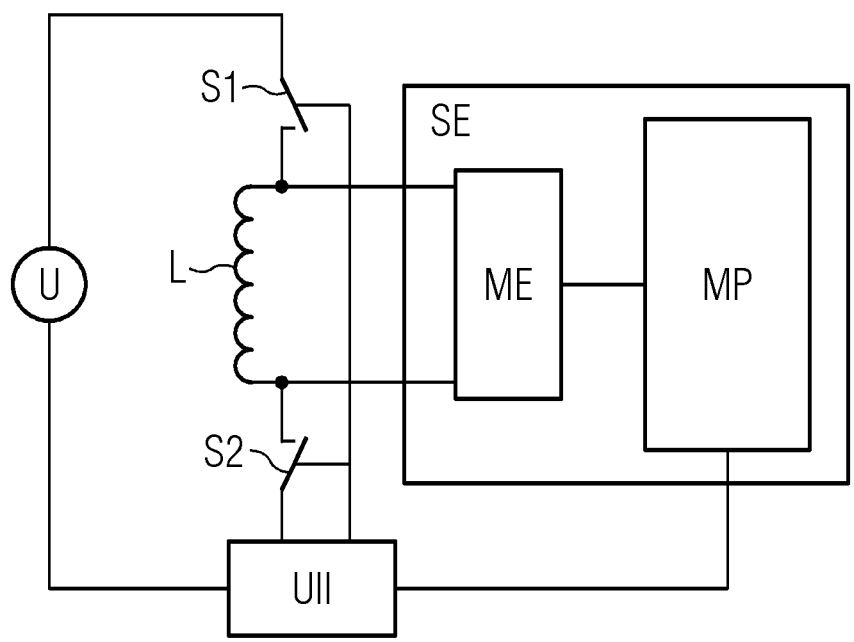
FIG. 2 shows a further second block diagram in explanation of an embodiment of the invention.

FIG. 2 shows an image according to FIG. 1, with the difference that the switches S1, S2 are controlled by the voltage indicator UII, in which a part of the control is implemented, and that the control unit SE has a measuring unit ME and a microprocessor MP.

The measuring unit ME executes various functions of the measuring value conversion, it can be, for example, an analog front end, furthermore, an analog/digital conversion can also be performed here, for example. The result of this measuring unit ME is supplied to the microprocessor MP.

The microprocessor MP can take over, for example, all or a part of the control functions which are implemented, for example, in firmware.

Figure 3:
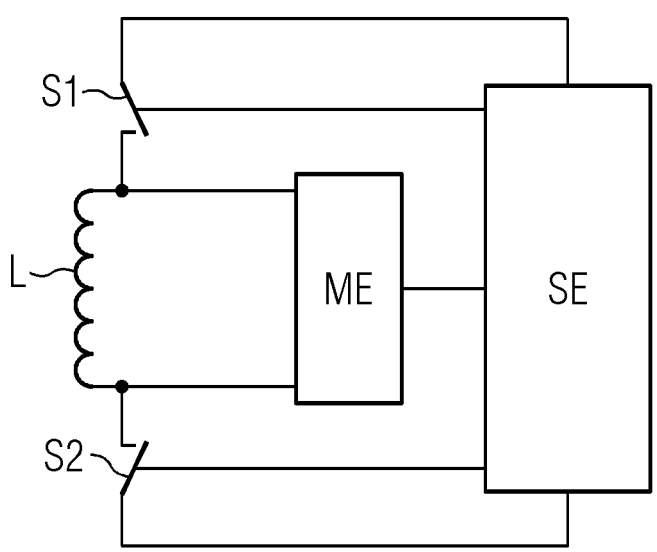
FIG. 3 shows a further third block diagram in explanation of an embodiment of the invention.

FIG. 3 shows an arrangement according to FIG. 2, with the difference that the measuring unit ME is designed as independent unit and the control unit SE also provides a test voltage which also handles the function of the voltage indicator. Control of the switches S1, S2 is also taken over by the control unit SE.

For example, the voltage indicator can be implemented directly by an input of a microprocessor containing the control unit which goes from Low into the High state in the presence of a voltage of greater than 2.1 volts. The control unit then provides a voltage of 3.3 volts.

If the control unit contains a microprocessor which bonds with firmware, a suitable firmware algorithm for testing the coil for operability can be run.

Figure 4:
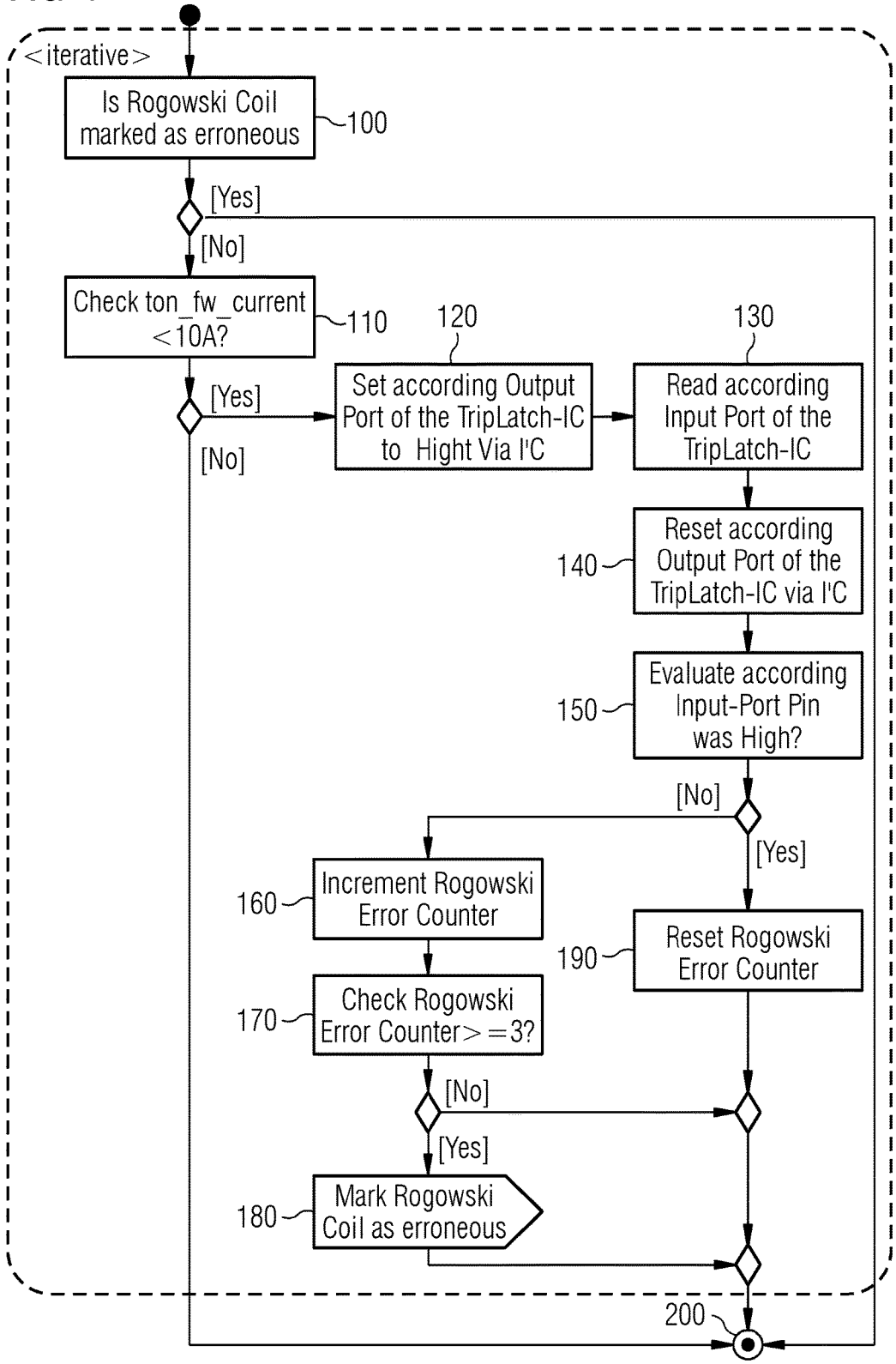
FIG. 4 shows a flowchart in explanation of an embodiment of the invention.

FIG. 4 shows a flowchart for such an algorithm.

In step 100, it is checked whether the coil, for example a Rogowski coil, has already been marked as faulty. In the positive case, the algorithm is already ended with step 200. In the negative case, the process continues with step 110 in which it is tested whether the current is below a second current limit I2, for example is less than 10 A in the case of an open circuit breaker. If it is not, the algorithm is ended with step 200. If the current is low enough, the process is continued with step 120 in which a test process is initiated and a test voltage is applied. Then, the corresponding voltage information is read in step 130, for example by interrogating the input terminal. In step 140, the test voltage connection is ended. In step 150, it is checked whether the first voltage value U1 has been reached or the input terminal was at High. In the positive case, an error counter for the coil is set to zero or reset, respectively, in step 190 and the algorithm is ended with step 200. In the negative case, an error counter is incremented in step 160. I.e., an error is not immediately reported but only if the error, i.e. missing voltage which indicates a wire break in the coil, occurs reproducibly or several times, respectively. In step 170, it is then checked whether the error counter has reached a value of, for example, 3, i.e. the test was negative three times so that there is a fault of the coil with certainty. If this is not reached as yet, the algorithm is ended for the first time with step 200. If the error counter is greater/equal to 3, for example, the coil is marked as faulty in step 180 and further actions (tripping the circuit breaker, information about faults by the output unit) can take place.

When the algorithm has ended, it can start again from the beginning.

In the text which follows, an embodiment of the invention will be represented briefly once more.

The control unit SE is designed in such a manner that, when a second current limit value I2, e.g. 1 ampere, is undercut and a first period of time t1, e.g. 200 ms, is exceeded, a connection of the test voltage is initiated for a second period of time, e.g. 20 ms in order to determine the operability of the coil.

Thus, a continuity check of the coil can take place. The result of the continuity check is determined by the control unit, for example by a firmware of the control unit. The result is advantageously available within a very short time, e.g. within 1 ms.

If the coil should be in order and a current flow takes place through the electrical conductor to be measured, the measurement values are only influenced unnoticeably.

Should the coil not have any continuity, e.g. the wire of the coil is broken, i.e. there is a fault, a parameterizable action can be carried out, for example. E.g. the electrical circuit can be interrupted, i.e. the circuit breaker tripped. Furthermore, an optical display, e.g. by way of an LED or a display, can be activated in order to indicate the fault. Furthermore, the fault can be reported by way of a communication unit, e.g. to a monitoring and/or management system.

Although the invention has been illustrated and described in detail by the preferred example embodiment, the invention is not restricted by the disclosed examples and other variations can be derived therefrom by the expert without departing from the scope of the invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A circuit breaker comprising:
   at least one coil to measure electric current of an electrical conductor of an electrical circuit, the at least one coil being connected to a control unit configured to compare the measured current or its equivalent with a first current limit value and, upon the first current limit value being exceeded, initiate an interruption of the electrical circuit, two terminals of the at least one coil being connected to one another by a series circuit including a first switch opened in its basic state, a voltage source and a voltage indicator, wherein the control unit is designed such that, upon a second current limit value being undercut for a first period of time, the first switch is closed for a second period of time, the voltage indicator is configured to compare the voltage present with a first voltage value and, upon the first voltage value being exceeded, to deliver information on an absence of faults of the at least one coil.

2. The circuit breaker of claim 1, wherein the coil is a Rogowski coil.

3. The circuit breaker of claim 1, wherein, in the series circuit, a second switch, opened in its basic state, is provided for the bipolar connection and disconnection of the series circuit to the coil.

4. The circuit breaker of claim 3, wherein a terminal of the first switch is connected to the first terminal of the coil and a terminal of the second switch is connected to the second terminal of the coil, and wherein the series-connected voltage source plus voltage indicator are located between the other two terminals of the switches.

5. The circuit breaker of claim 1, wherein the voltage source is a direct-voltage source.

6. The circuit breaker of claim 1, wherein the voltage indicator includes a Schmitt trigger.

7. The circuit breaker of claim 1, wherein the control unit includes a microprocessor.

8. The circuit breaker of claim 1, wherein the control unit includes a high-impedance input to which the coil is connected.

9. The circuit breaker of claim 1, further comprising:
   an output unit, connected to the control unit, configured to at least one of optically, acoustically and wirelessly deliver information on a lack of absence of faults.

10. The circuit breaker of claim 1, wherein the control unit is designed such that an interruption of the electrical circuit is initiated in the case of a fault of the coil.

11. The circuit breaker of claim 1, wherein at least one of the first and second period of time is parameterizable.

12. The circuit breaker of claim 1, wherein the control unit is designed such that when the series circuit or test voltage, respectively, is connected, an interruption of the electrical circuit is prevented.

13. The circuit breaker of claim 1, wherein at least one of the second current limit value lies within the range of 500 mA to 20 A, the first period of time lies within the range of 5 ms to 50 s, and the second period of time lies within the range of 10 microseconds to 10 seconds.

14. A method for a circuit breaker, the method comprising:

measuring, using a coil of the circuit breaker, electric current of an electrical conductor of an electrical circuit;

comparing the measured current or an equivalent of the measured current with a first current limit value;

initiating an interruption of the electrical circuit upon the first current limit value being exceeded; and initiating, upon a second current limit being undercut and a first period of time being exceeded, a connection of a test voltage, via a series-connected voltage indicator, to the coil for a second period of time, wherein upon a first voltage value being exceeded, information on operability of the coil is present on the series-connected voltage indicator.

15. The method of claim 14, wherein the connection takes place in a bipolar manner.

16. The circuit breaker of claim 2, wherein, in the series circuit, a second switch, opened in its basic state, is provided for the bipolar connection and disconnection of the series circuit to the coil.

17. The circuit breaker of claim 16, wherein a terminal of the first switch is connected to the first terminal of the coil and a terminal of the second switch is connected to the second terminal of the coil, and wherein the series-connected voltage source plus voltage indicator are located between the other two terminals of the switches.

18. The method of claim 14, further comprising:

at least one of optically, acoustically and wirelessly delivering the information on operability of the coil.

19. The method of claim 14, wherein at least one of the first and second period of time is parameterizable.

* * * * *